US009083384B2

(12) United States Patent
Sakuragi et al.

(10) Patent No.: US 9,083,384 B2
(45) Date of Patent: Jul. 14, 2015

(54) MICROCOMPUTER SYSTEM (75) Inventors: Atsushi Sakuragi, Tokyo (JP); Hiroshi Hayaoka, Tokyo (JP); Takayuki Takeuchi, Tokyo (JP)

(73) Assignee: RENESAS ELECTRONICS CORPORATION, Kanagawa (JP)

( * ) Notice: Subject to any disclaimer, the term of this patent is extended or adjusted under 35 U.S.C. 154(b) by 719 days.

(21) Appl. No.: 13/436,306

(22) Filed: Mar. 30, 2012

(65) Prior Publication Data

US 2012/0248894 A1 Oct. 4, 2012

Related U.S. Application Data (63) Continuation of application No. 12/667,854, filed as application No. PCT/JP2008/061900 on Jul. 1, 2008, now Pat. No. 8,415,836.

(30) Foreign Application Priority Data

Aug. 16, 2007 (JP) ................................. 2007-212224

(51) Int. Cl.
*H04Q 3/00* (2006.01)
*H03M 11/22* (2006.01)
*G06F 3/023* (2006.01)

(52) U.S. Cl.
CPC .............. *H03M 11/22* (2013.01); *G06F 3/023* (2013.01); *Y10T 307/76* (2015.04)

(58) Field of Classification Search
CPC ....... H03M 11/04; H03M 11/22; G06F 3/023; G06F 15/78
USPC ......................................................... 307/115
See application file for complete search history.

(56) References Cited

U.S. PATENT DOCUMENTS 4,665,965 A * 5/1987 Pasquier et al. ............... 160/310
5,198,735 A 3/1993 Taylor et al.
(Continued)

FOREIGN PATENT DOCUMENTS

JP 4-30627 2/1992
JP 4-125719 A 4/1992
(Continued)

OTHER PUBLICATIONS

Japanese Decision of Refusal, w/ partial English translation thereof, issued in Japanese Patent Application No. JP 2012-184758 dated Oct. 29, 2013.
(Continued)

*Primary Examiner* — Jared Fureman
*Assistant Examiner* — Alfonso Perez Borroto
(74) *Attorney, Agent, or Firm* — McDermott Will & Emery LLP (57) ABSTRACT It is an object of the present invention to provide a technology that a microcomputer is capable of detecting the states of a large number of switches with a small number of ports. In a microcomputer system according to the present invention, any one of ($2^N$–1) kinds of the combination patterns with respect to the combination of N input ports (IP1 to IP4) of a microcomputer (1) is allocated to each of M push-down switches (SW12, SW13, SW14, SW23, SW24, and SW34) with the different combination from each push-down switch. Each push-down switch inverts the input levels of the input ports in the combination pattern allocated thereto when pushed down. The microcomputer (1) detects the state of each push-down switch on the basis of the input levels of the N input ports.

3 Claims, 10 Drawing Sheets

(56) References Cited

U.S. PATENT DOCUMENTS

| | | | |
|---|---|---|---|
| 5,534,860 A * | 7/1996 | Phillips et al. | 341/22 |
| 5,610,675 A * | 3/1997 | Iwamatsu et al. | 396/315 |
| 5,744,874 A | 4/1998 | Yoshida et al. | |
| 5,760,493 A * | 6/1998 | Outcalt et al. | 307/38 |
| 5,798,716 A * | 8/1998 | Davis | 341/26 |
| 6,800,965 B1 * | 10/2004 | Turner et al. | 307/128 |
| 6,980,135 B2 * | 12/2005 | Chang et al. | 341/26 |
| 8,013,761 B2 * | 9/2011 | Mayer | 341/26 |
| 2001/0054971 A1 * | 12/2001 | King | 341/22 |
| 2004/0117553 A1 * | 6/2004 | Kurakata et al. | 711/115 |
| 2004/0120195 A1 * | 6/2004 | Okuda | 365/200 |
| 2004/0168663 A1 * | 9/2004 | Matsuura et al. | 123/179.2 |
| 2006/0082382 A1 * | 4/2006 | Hosono | 326/21 |
| 2007/0016347 A1 * | 1/2007 | Yoshida | 701/36 |
| 2008/0148107 A1 * | 6/2008 | Takaishi et al. | 714/51 |
| 2008/0151449 A1 * | 6/2008 | Yama et al. | 361/78 |
| 2008/0238728 A1 * | 10/2008 | Motoe | 341/24 |

FOREIGN PATENT DOCUMENTS

| | | |
|---|---|---|
| JP | 9-44229 | 2/1997 |
| JP | 2001-255983 | 9/2001 |
| JP | 2007-102643 A | 4/2007 |

OTHER PUBLICATIONS

JP Pub 2007-104174 to Nishiyama, English abstract, Apr. 19, 2007.
JP Patent 07-13671 to Otani et al., English abstract, Jan. 17, 1995.
Japanese Office Action with English Translation issued in Japanese Application No. 2012-184758 mailed May 14, 2013.
Japanese Office Action, and English translation thereof, issued in Japanese Patent Application No. 2009-528054 dated May 7, 2012.

* cited by examiner

|     | OFF | SW12 | SW13 | SW14 | SW23 | SW24 | SW34 |
|-----|-----|------|------|------|------|------|------|
| IP1 | 1   | 0    | 0    | 0    | 1    | 1    | 1    |
| IP2 | 1   | 0    | 1    | 1    | 0    | 0    | 1    |
| IP3 | 1   | 1    | 0    | 1    | 0    | 1    | 0    |
| IP4 | 1   | 1    | 1    | 0    | 1    | 0    | 0    |

|  | OFF | SW1 | SW2 | SW3 | SW4 | SW12 | SW13 | SW14 | SW23 | SW24 | SW34 | SW123 | SW124 | SW134 | SW234 | SW1234 |
|---|---|---|---|---|---|---|---|---|---|---|---|---|---|---|---|---|
| IP1 | 1 | 0 | 1 | 1 | 1 | 0 | 0 | 0 | 1 | 1 | 1 | 0 | 0 | 0 | 1 | 0 |
| IP2 | 1 | 1 | 0 | 1 | 1 | 0 | 1 | 1 | 0 | 0 | 1 | 0 | 0 | 1 | 0 | 0 |
| IP3 | 1 | 1 | 1 | 0 | 1 | 1 | 0 | 1 | 0 | 1 | 0 | 0 | 1 | 0 | 0 | 0 |
| IP4 | 1 | 1 | 1 | 1 | 0 | 1 | 1 | 0 | 1 | 0 | 0 | 1 | 0 | 0 | 0 | 0 |

|  | OFF | SWA1B1 | SWA2B1 | SWA1B2 | SWA2B2 |
|---|---|---|---|---|---|
| IPA1 | 1 | 0 | 1 | 0 | 1 |
| IPA2 | 1 | 1 | 0 | 1 | 0 |
| IPB1 | 0 | 1 | 1 | 0 | 0 |
| IPB2 | 0 | 0 | 0 | 1 | 1 |

MICROCOMPUTER SYSTEM

RELATED APPLICATIONS

This application is a Continuation of U.S. application Ser. No. 12/667,854, filed on Jan. 5, 2010, now U.S. Pat. No. 8,415,836 which is the U.S. National Phase under 35 U.S.C. §371 of International Application No. PCT/JP2008/061900, filed on Jul. 1, 2008, which in turn claims the benefit of Japanese Application No. 2007-212224, filed on Aug. 16, 2007, the disclosures of which Applications are incorporated by reference herein.

TECHNICAL FIELD

The present invention relates to a microcomputer system using ports of a microcomputer to detect the states of a plurality of switches.

BACKGROUND ART

For instance, as recited in patent document 1, various technologies are conventionally proposed relating to a microcomputer system using ports of a microcomputer to detect the states of a plurality of switches.

Patent document 1: Japanese Patent Application Laid-Open No. 2001-255983

The microcomputer system described above is required to detect the states of a large number of switches with as few ports as possible in order to simplify a circuit configuration.

It is also required to simplify a process of detecting the states of switches in the microcomputer in order to reduce power consumption.

DISCLOSURE OF INVENTION

The present invention has been made in view of the above points, and a first object thereof is to provide a technology that a microcomputer is capable of detecting the states of a large number of switches with a small number of ports. A second object of the present invention is to provide a technology capable of simplifying a process of detecting the states of switches in a microcomputer.

A microcomputer system according to one embodiment of the invention includes a microcomputer with four input ports and a plurality of push-down switches. Any one of 15 ($=2^4-1$) kinds of combination patterns with respect to the combination of the four input ports (including the case of a single input port) is allocated to each of the plurality of push-down switches with the different combination pattern from each push-down switch. Each push-down switch inverts the input levels of the input ports in the allocated combination pattern when turning to be on state. Then, the microcomputer detects the state of each push-down switch on the basis of the inputs levels of the input ports.

Further, a microcomputer system according to another embodiment of the invention includes; a microcomputer including two first input ports pulled up to a power supply potential through a resistor and two second input ports pulled down to a reference potential through a resistor, and a plurality of push-down switches. Either one of the two first input ports and either one of the two second input ports are allocated to each of the plurality of push-down switches with the different combination pattern from each push-down switch. For each push-down switch, when this push-down switch turns to be on-state, the first and second input ports allocated to this push-down switch are electrically connected to each other to invert the input levels of these first and second input ports, and then the microcomputer detects the state of each push-down switch on the basis of the input levels of the first and second input ports.

In the microcomputer system according to one embodiment of the invention, the push-down switch itself inverts the input levels of the input ports of the microcomputer, thereby allowing the microcomputer to detect the on-state of the push-down switch without using an output port. Further, any one of 15 ($=2^4-1$) kinds of combination patterns with respect to the combination of the four input ports (including the case of a single input port) is allocated to each of the plurality of push-down switches with the different combination from each push-down switch. Each push-down switch inverts the input levels of the input ports in the allocated combination pattern when turning to be on-state, thereby allowing the microcomputer to detect the on-state of 15 ($=2^4-1$) push-down switches at most. Thus, the microcomputer detects the states of a large number of push-down switches with a small number of ports.

In the microcomputer system according to another embodiment of the invention, either one of the two first input ports and either one of the two second input ports are allocated to each of the plurality of push-down switches with the different combination pattern from each push-down switch, and for each of the push-down switches, when this push-down switch turns to be on-state, the first and second input ports allocated to this push-down switch are electrically connected to each other to invert the input levels of these first and second input ports, allowing the microcomputer to detect the on-state of each push-down switch using only input ports. Thus, the microcomputer detects the state of each push-down switch without outputting a signal through an output port. As a result, a process of detecting the state of each push-down switch in the microcomputer is simplified.

These and other objects, features, aspects and advantages of the present invention will become more apparent from the following detailed description of the present invention when taken in conjunction with the accompanying drawings.

BEST MODE FOR CARRYING OUT THE INVENTION

First Preferred Embodiment

Figure 1:
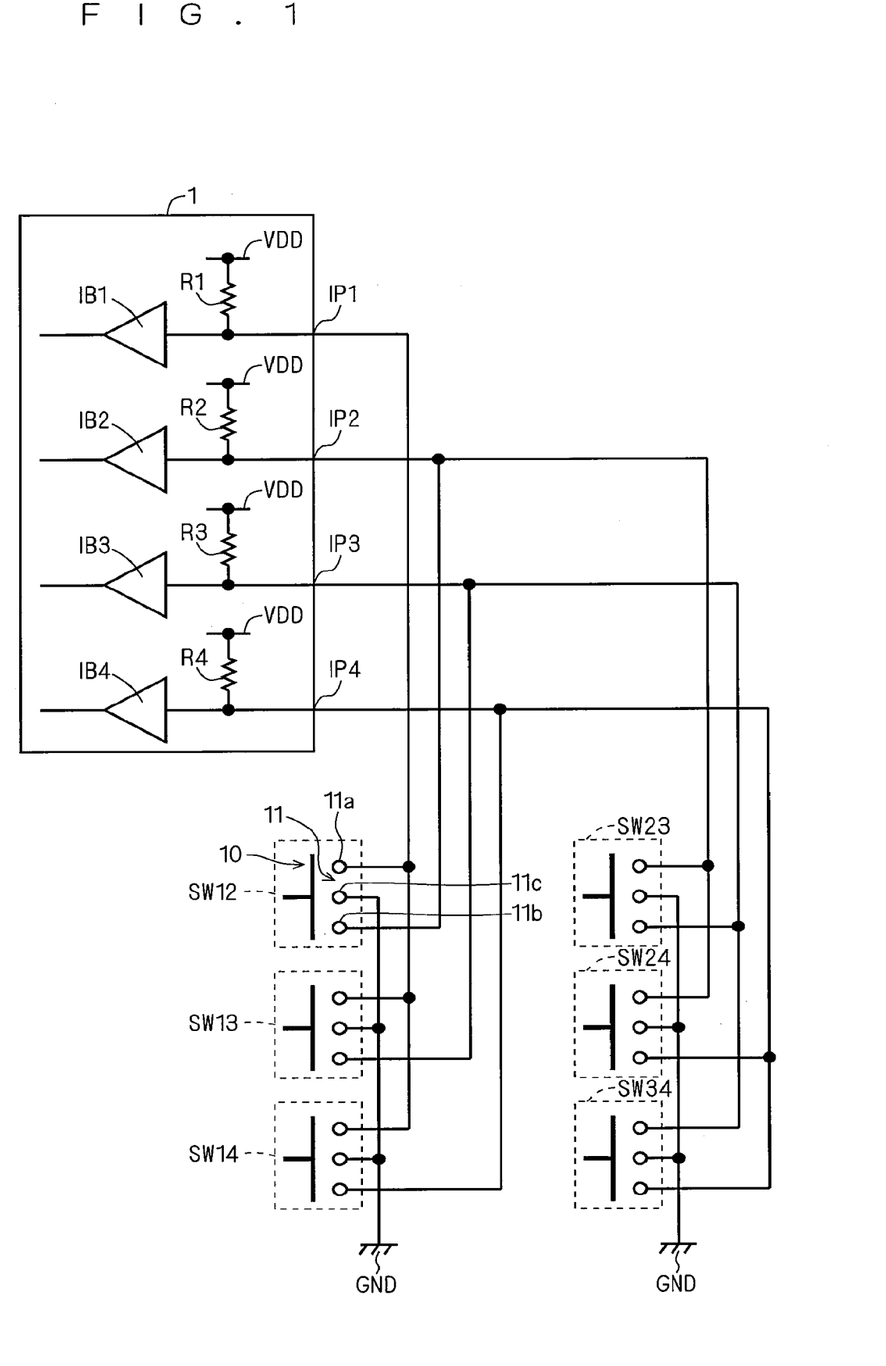
FIG. 1 is a view showing a configuration of a microcomputer system according to a first preferred embodiment of the invention.

FIG. 1 is a view showing a configuration of a microcomputer system according to a first preferred embodiment of the invention. The microcomputer system according to the first preferred embodiment is used for, for example, key button input parts of infrared remote control devices of consumer electronic devices such as a television and the like, mobile phone devices, and portable terminal devices.

As shown in FIG. 1, the microcomputer system according to the first preferred embodiment includes a microcomputer 1 composed of a CPU, a memory, and the like, and a plurality of push-down switches (also referred to as "key switches") SW12, SW13, SW14, SW23, SW24, and SW34, which are housed in a casing of remote control devices and the like.

The microcomputer 1 includes a plurality of input ports IP1 to IP4. The input ports IP1 to IP4 are connected to input terminals of input buffers IB1 to IB4, respectively, and input signals of the input ports IP1 to IP4 are inputted to a predetermined circuit in the microcomputer 1 via the input buffers IB1 to IB4, respectively. The input ports IP1 to IP4 are pulled up to a power supply potential VDD via resistors R1 to R4, respectively. Accordingly, the power supply potential VDD is applied to the input ports IP1 to IP4 via the resistors R1 to R4, respectively. Hereinafter, when there is no need to distinguish the input ports IP1 to IP4, each of them is referred to as an "input port IP". Also, when there is no need to distinguish the input buffers IB1 to IB4, each of them is referred to as an "input buffer IB".

Each of the push-down switches SW12, SW13, SW14, SW23, SW24, and SW34 includes a push-down part 10, and a fixed part 11 making contact with this push-down part 10 when this push-down part 10 is pushed down, and is turned to be in conduction state (on-state) when the pushed-down part 10 and the fixed part 11 electrically make contact with each other. The fixed part 11 includes a plurality of contact points 11a to 11c making contact with the push-down part 10. Each of the contact points 11a and 11b is connected to any one of the input ports IP1 to IP4, and the contact point 11c is connected to a reference potential GND, to fix the potential. When the push-down part 10 makes contact with the contact points 11a to 11c of the fixed part 11, the contact points 11a to 11c are resulted in electrically connecting to one another, applying the reference potential GND to the contact points 11a and 11b. Hereinafter, when there is no need to distinguish the push-down switches SW12, SW13, SW14, SW23, SW24, and SW34, each of them is referred to as a "push-down switch SW".

Any one of several kinds of combination patterns with respect to the combination of a plurality of input ports IP is allocated to each push-down switch SW with the different combination pattern from each push-down switch. Here, the case of a single input port IP is included in the combination of the input ports IP. That is, one combination pattern is composed of even a single input port IP. Since four input ports IP1 to IP4 are provided in the microcomputer 1 according to the first preferred embodiment, the combination patterns of these input ports IP1 to IP4 are to be 15 ($=2^4-1$) kinds.

In the first preferred embodiment, the number of the push-down switches is six, and thus, it is smaller than the total number of the combination patterns (15 kinds) made by four input ports IP1 to IP4. Therefore, in the first preferred embodiment, the combination pattern composed of two input ports IP out of the combination patterns of four input ports IP1 to IP4 is allocated to each push-down switch SW with the different combination pattern from each push-down switch. For instance, the combination pattern of the input port IP1 and the input port IP2 is allocated to the push-down switch SW12, and the combination pattern of the input port IP1 and the input port IP3 is allocated to the push-down switch SW13. Further, the combination pattern of the input port IP1 and the input port IP4 is allocated to the push-down switch SW14, and the combination pattern of the input port IP2 and the input port IP3 is allocated to the push-down switch SW23. Then, the combination pattern of the input port IP2 and the input port IP4 is allocated to the push-down switch SW24, and the combination pattern of the input port IP3 and the input port IP4 is allocated to the push-down switch SW34.

Then, in each push-down switch, two input ports IP in the combination pattern of the input ports IP allocated to the push-down switch is connected to two contact points 11a and 11b of the fixed part 11, respectively. That is, the input ports IP1 and IP2 are connected to the contact points 11a and 11b of the fixed part 11 in the push-down switch SW12, respectively, and the input ports IP1 and IP3 are connected to the contact points 11a and 11b of the fixed part 11 in the push-down switch SW13, respectively. Further, the input ports IP1 and IP4 are connected to the contact points 11a and 11b of the fixed part 11 in the push-down switch SW14, respectively, and the input ports IP2 and IP3 are connected to the contact points 11a and 11b of the fixed part 11 of the push-down switch SW23, respectively. Then, the input ports IP2 and IP4 are connected to the contact points 11a and 11b of the fixed part 11 in the push-down switch SW24, respectively, and the input ports IP3 and IP4 are connected to the contact points 11a and 11b of the fixed part 11 in the push-down switch SW34.

Figure 2:
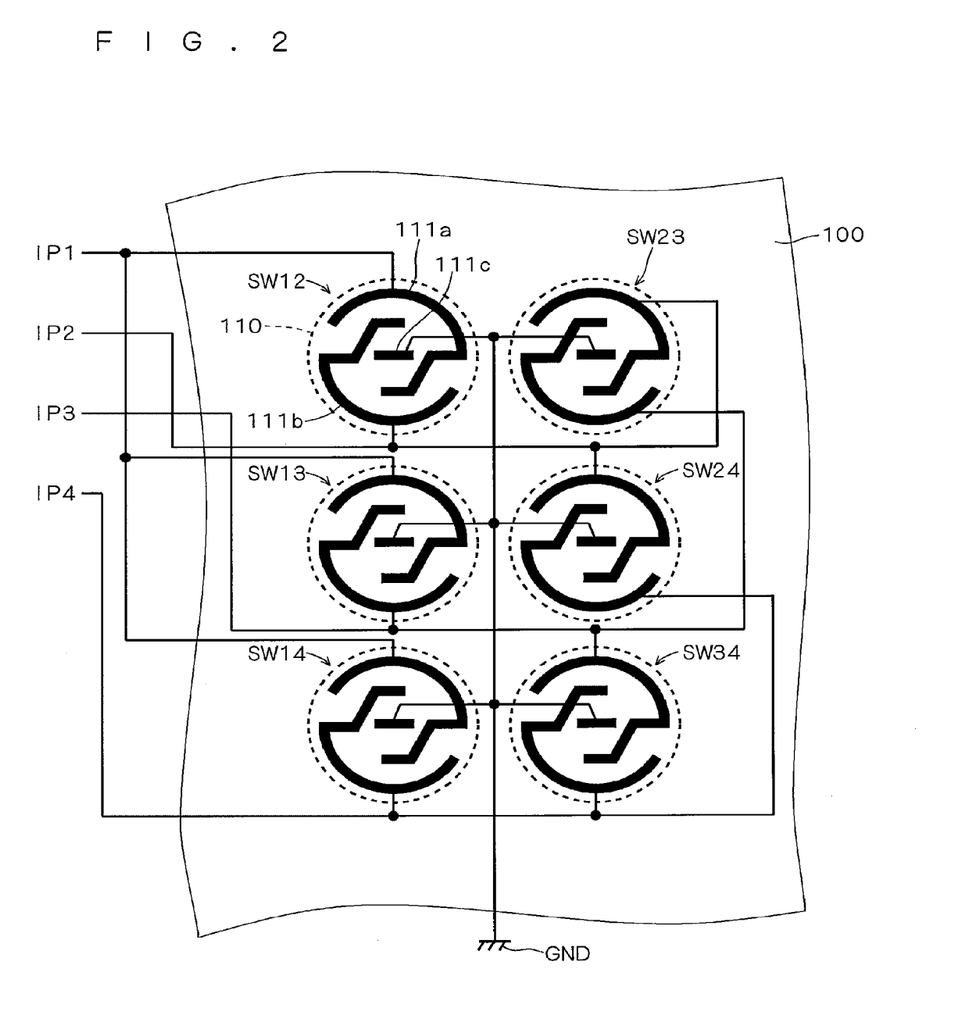
FIG. 2 is a view showing a configuration of push-down switches according to the first preferred embodiment of the invention.

FIG. 2 is a plane view showing a configuration of each push-down switch in detail. As shown in FIG. 2, a plurality of the push-down switches are arranged in a matrix. The push-down part 10 is composed of, for example, a cylindrical conductive rubber 110. The conductive rubber 110 to be an electric conductor is exposed from a casing housing the microcomputer system, allowing a user to operate for pushing down.

The fixed part 11 is composed of three carbon patterns 111a to 111c formed by printing on a substrate 100 of such as a cardboard, a glass epoxy substrate, and the like. The microcomputer 1 is formed on the substrate 100. The carbon patterns 111a and 111b are electrically connected to two input ports IP allocated to the push-down switch which they belong to, respectively, and the carbon pattern 111c is connected to the reference potential GND. The conductive rubber 110, and the carbon patterns 111a to 111c to be electric conductors are disposed to oppose to one another, and the carbon patterns 111a to 111c include the contact points 11a to 11c on surfaces at a side of the conductive rubber 110, respectively. When the conductive rubber 110 exposed from the casing is pushed down, the conductive rubber 110 moves to a side of the substrate 100 so that the conductive rubber 110 and the carbon patterns 111a to 111c make contact with one another. Thereby, the push-down switch SW is turned to be on-state, and the carbon patterns 111a to 111c are electrically connected to one another with the conductive rubber 110. In FIG. 2, an outline of the conductive rubber 110 is shown in broken line for convenience of explanation.

In the microcomputer system according to the first preferred embodiment having the above configuration, when each push-down switch SW is off-state, every input level of the input ports IP1 to IP4 becomes Hi level ("1"). The power supply potential VDD is supplied to the input ports IP via resistors. When a certain push-down switch SW is pushed down to be on-state, the contact points 11a to 11c of the fixed part 11 in this push-down switch SW are electrically connected to one another, and the potential of the contact points 11a and 11b becomes the reference potential GND, changing the input levels of two input ports IP connected to the contact points 11a and 11b from Hi level to Low level ("0"). That is, when the push-down switch SW is pushed down, the input levels of the two input ports IP in the combination pattern of the input ports IP allocated to that push-down switch SW are inverted. The microcomputer 1 specifies the two input ports IP in which the input levels are inverted, so as to determine that the push-down switch SW, to which the combination pattern composed of those two input ports IP is allocated, is on-state.

Figure 3:
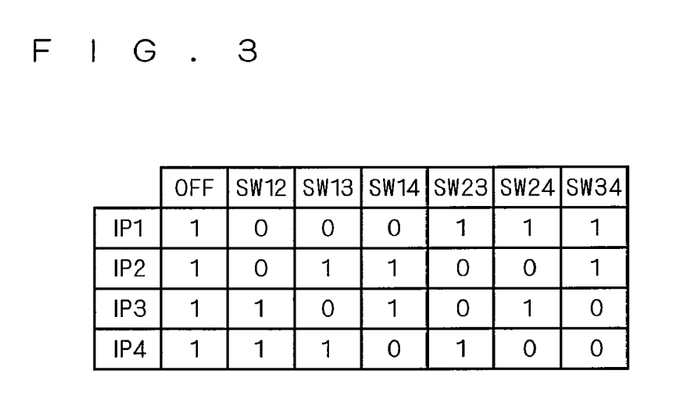
FIG. 3 is a view showing input levels of input ports when the push-down switches are pushed down in the microcomputer system according to the first preferred embodiment of the invention.

FIG. 3 is a view showing the input levels of the input ports IP1 to IP4 when each push-down switch SW is on-state. As shown in FIG. 3, when the push-down switch SW12 is pushed down to be on-state, the input levels of the input ports IP1 and IP2 are inverted to be "0". When the push-down switch SW13 is turned to be on-state, the input levels of the input ports IP1 and IP3 are inverted to be "0". Then, when the push-down switch SW14 is turned to be on-state, the input levels of the input ports IP1 and IP4 are inverted, when the push-down switch SW23 is turned to be on-state, the input levels of the input ports IP2 and IP3 are inverted, when the push-down switch SW24 is turned to be on-state, the input levels of the input ports IP2 and IP4 are inverted, and when the push-down switch SW34 is turned to be on-state, the input levels of the input ports IP3 and IP4 are inverted.

In the first preferred embodiment, since the different combination pattern of input ports IP from each push-down switch is allocated to each push-down switch SW, the combination patterns of the input levels of the input ports IP1 to IP4 at the time of pushing down are different from each other, as shown in FIG. 3. That is, when each push-down switch SW is pushed down, 4-bit data of different bit strings from each other is inputted to four input ports IP1 to IP4. Thus, the microcomputer 1 detects which push-down switch SW is pushed down by confirming the input levels of the input ports IP1 to IP4, i.e., the input data.

Here, the microcomputer 1 according to the first preferred embodiment is capable of performing a sleep operation partially stopping its function. In the sleep operation, the microcomputer 1 stops oscillation of a system clock, for example. Thereby, the operation of a CPU in the microcomputer 1 is stopped, allowing the power consumption to be greatly reduced.

The microcomputer 1 usually performs the sleep operation to reduce the power consumption. The push-down switch SW is pushed down and the input levels of two input ports IP allocated thereto becomes Low level, so that the microcomputer 1 wakes up to start the oscillation of the system clock, and the CPU in the microcomputer 1 starts the operation. The CPU having started the operation confirms the input levels of the input ports IP1 to IP4 so as to specify the push-down switch SW that is on-state, and performs a process in accordance with the push-down switch SW having been pushed down. Thereafter, the sleep operation restarts and enters into a power-down mode in the microcomputer 1.

An infrared remote controller used for consumer electric appliances may output infrared rays only when a user operates it. Therefore, when the microcomputer system is used for this infrared remote controller, usually setting the operation of the microcomputer 1 to be the sleep operation, as in the first preferred embodiment, the microcomputer 1 may wake up when the push-down switch SW is pushed down so as to allow the CPU of the microcomputer 1 to perform a predetermined process, thereby outputting the infrared rays. The process to wake up the microcomputer performing the sleep operation by pushing down the push-down switch is referred to as "key-on wake up".

As described above, in the microcomputer system according to the first preferred embodiment, the conductive rubber 110 of the push-down part 10 makes contact with the carbon patterns 111a to 111c in the fixed part 11 so that the push-down switch SW itself inverts the input levels of the input ports IP of the microcomputer 1 connected thereto, thereby allowing the microcomputer 1 to detect the on-state of the push-down switch SW without using the output port.

Furthermore, any one of ($2^4-1$) kinds of the combination patterns with respect to the combination of four input ports IP (including the case of a single input port IP) is allocated to each of the plurality of the push-down switches SW with the different combination pattern from each push-down switch. Each push-down switch SW inverts the input levels of the input ports IP in the allocated combination pattern when turning to be on-state, so that the microcomputer 1 individually detects the on-state of each of the ($2^4-1$) push-down switches SW at most. More generally, the microcomputer 1 including N ($\geq 2$) input ports IP individually detects the on-state of each of the ($2^N-1$) push-down switches SW at most. Thus, the microcomputer 1 detects the state of a large number of the push-down switches SW with a small number of ports, comparing to the technology recited in the above patent document 1.

Figure 4:
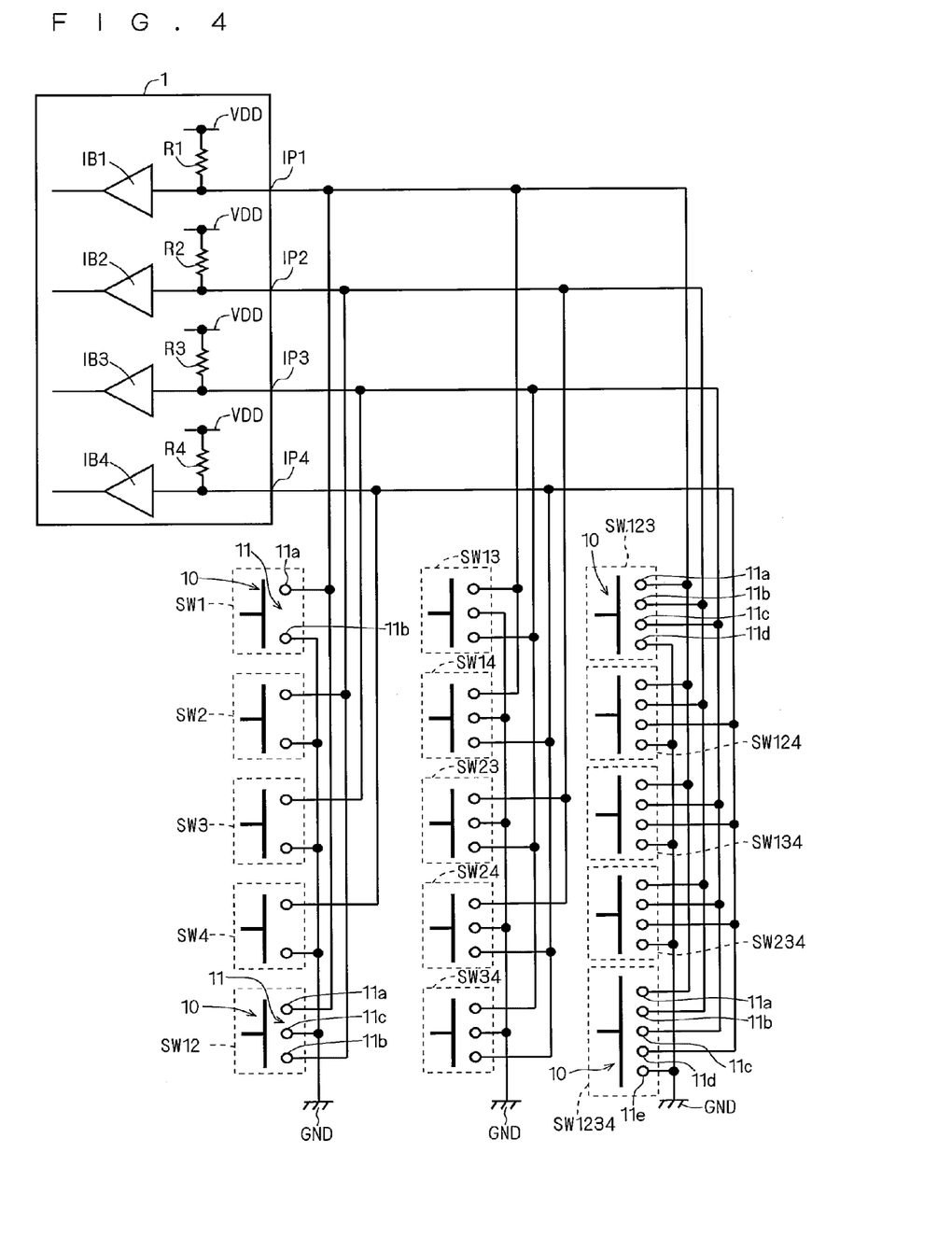
FIG. 4 is a view showing a configuration showing a modification of the microcomputer system according to the first preferred embodiment of the invention.

FIG. 4 is a view showing a configuration of the microcomputer system in detecting the states of the ($2^4-1$) push-down switches SW in the microcomputer 1 including four input ports IP1 to IP4. The microcomputer system shown in FIG. 4 is provided with 15 push-down switches SW1, SW2, SW3, SW4, SW12, SW13, SW14, SW23, SW24, SW34, SW123, SW124, SW134, SW234, and SW1234. Hereinafter, when there is no need to distinguish these push-down switches, each of them is referred to as a "push-down switch SW" as in the above.

Each push-down switch SW includes a push-down part 10 and a fixed part 11 making contact with this push-down part 10 when this push-down part 10 is pushed down, as in the example of FIG. 3. Each of the fixed parts 11 in the push-down switches SW1 to SW4 includes two contact points 11a and 11b making contact with the push-down part 10. The contact port 11a is connected to any one of the input ports IP1 to IP4, and the reference potential GND is connected to the contact point 11b. Each of the fixed parts 11 in the push-down switches SW123, SW124, SW134, and SW234 includes four contact points 11a to 11d making contact with the push-down part 10. Each of the contact points 11a to 11c is connected to any one of the input ports IP1 to IP4, and the reference potential GND is connected to the contact point 11d. The fixed part 11 in the push-down switch SW1234 includes five contact points 11a to 11e making contact with the push-down part 10. The contact points 11a to 11d are connected to the input ports IP1 to IP4, respectively, and the reference potential GND is connected to the contact point 11e. The configurations of the push-down switches SW12, SW13, SW14, SW23, SW24, and SW34 are as described above.

Any one of 15 kinds combination patterns with respect to the combination of four input ports IP is allocated to each push-down switch SW with the different combination from each push-down switch. Specifically, the combination pattern composed of the input port IP1 is allocated to the push-down switch SW1, the combination pattern composed of the input port IP2 is to the push-down switch SW2, the combination pattern composed of the input port IP3 is to push-down switch SW3, and the combination pattern composed of the input port IP4 is to the push-down switch SW4, respectively. Further, the combination pattern of the input ports IP1, IP2, and IP3 is allocated to the push-down switch SW123, the combination pattern of the input ports IP1, IP2, and IP4 is to the push-down switch SW124, the combination pattern of the input ports IP1, IP3, and IP4 is to the push-down switch SW134, the combination pattern of the input ports IP2, IP3, and IP4 is to the push-down switch SW234, and the combination pattern of the input ports IP1, IP2, IP3, and IP4 is to the push-down switch SW1234, respectively. The allocation of the combination patterns of the input ports IP for the push-down switches SW12, SW13, SW14, SW23, and SW34 is as described above.

In each of the push-down switches SW1 to SW4, the contact point 11a of the fixed part 11 is connected to the input port IP in the combination pattern allocated to the push-down switch SW. For instance, the contact point 11a in the push-down switch SW1 is connected to the input port IP1 in the combination pattern allocated to this push-down switch SW1.

Further, in each of the push-down switches SW123, SW124, SW134, and SW234, three contact points 11a to 11c in the fixed part 11 are connected to three input ports IP in the combination pattern allocated to the push-down switch SW, respectively. For instance, the contact points 11a to 11c in the push-down switch SW123 are connected to three input ports IP1 to IP3 in the combination pattern allocated to this push-down switch SW123, respectively.

Still further, four contact points 11a to 11d of the fixed part 11 in the push-down switch SW1234 are connected to four input ports IP1 to IP4 in the combination pattern allocated to the push-down switch SW1234, respectively.

The connection relationship of the input ports IP and the contact points 11a and 11b of the fixed part 11 in the push-down switches SW12, SW13, SW14, SW23, SW24, and SW34 is as described above.

In each of the push-down switches SW1 to SW4, the push-down part 10 makes contact with the contact points 11a and 11b when pushed down, electrically connecting the contact points 11a and 11b. As a result, the reference potential GND is applied to the contact point 11a to invert the input level of the input port IP connected to the contact point 11a.

Further, in each of the push-down switches SW12, SW13, SW14, SW23, SW24, and SW34, the push-down part 10 makes contact with the contact points 11a to 11c when pushed down, electrically connecting the contact points 11a and 11b. As a result, the reference potential GND is applied to the contact points 11a and 11b to invert the input levels of the two input ports IP connected to the contact points 11a and 11b.

Still further, in each of the push-down switches SW123, SW124, SW134, and SW234, the push-down part 10 makes contact with the contact points 11a to 11d, electrically connecting the contact points 11a to 11c. As a result, the input levels of the three input ports IP connected to the contact points 11a to 11c are inverted.

Still further, in the push-down switch SW1234, the push-down part 10 makes contact with the contact points 11a to 11e when pushed down, electrically connecting the contact points 11a to 11d. As a result, the input levels of the four input ports IP1 to IP4 connected to the contact points 11a to 11d are inverted.

Figure 5:
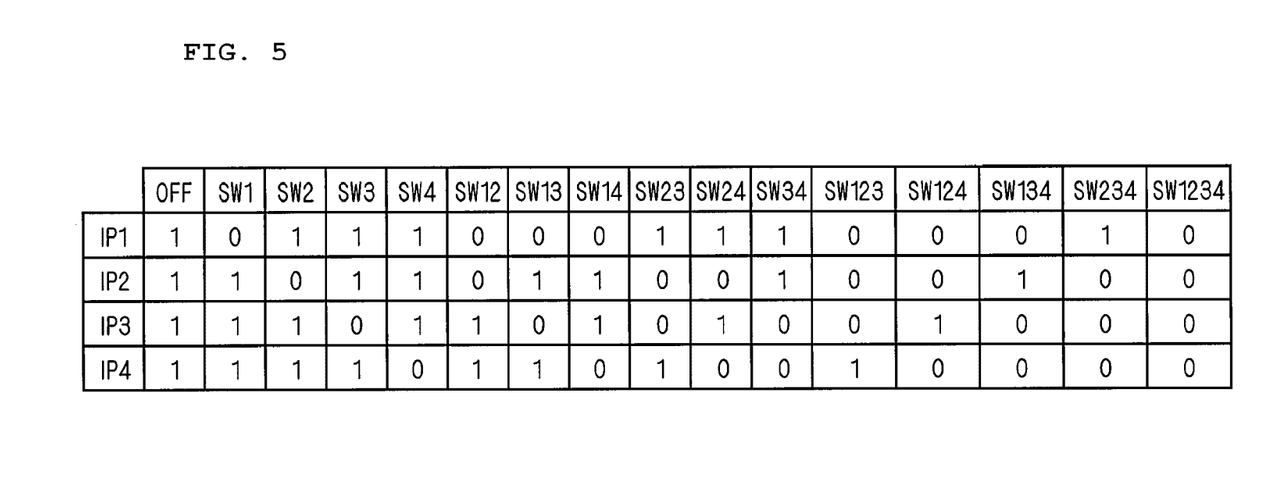
FIG. 5 is a view showing the input levels of the input ports when the push-down switches are pushed down in the modification of the microcomputer system according to the first preferred embodiment of the invention.

FIG. 5 is a view showing the input levels of the input ports IP1 to IP4 when each push-down switch SW is pushed down in the microcomputer system shown in FIG. 4. As shown in FIG. 5, in the 15 push-down switches, the combination patterns of the input levels of the input ports IP1 to IP4 at the time of pushing down are different from each other. That is, when each push-down switch SW is pushed down, 4-bit data of different bit strings from each other is inputted to four input ports IP1 to IP4. Thus, the microcomputer 1 individually detects the state of each push-down switch SW on the basis of the input levels of the input ports IP1 to IP4.

In the microcomputer system shown in FIG. 3, when a plurality of the push-down switches SW are pushed down at the same time, the input levels of three or more input ports IP are inverted. For instance, when the push-down switches SW12 and SW13 are pushed down at the same time to be on-state, the input levels of the input ports IP1, IP2, and IP3 are inverted. Also, when the push-down switches SW12 and SW34 are pushed down at the same time to be on-state, the input levels of the input ports IP1, IP2, IP3, and IP4 are inverted. Thus, the microcomputer 1 detects that a plurality of the push-down switches SW are pushed down at the same time, by confirming that the input levels of three or more input ports IP are inverted.

The aforementioned patent document 1 have proposed the technology capable of increasing the number of the push-down switches whose states can be detected with a microcomputer, by switching input and output of a plurality of ports in the microcomputer. In this technology, if the microcomputer performs the same sleep operation as in the first preferred embodiment to stop the operation of the CPU in the microcomputer, the input and output of the port cannot be switched. From this, there exists push-down switches impossible to be used for key-on wake up. Accordingly, the technology described in the patent document 1 is a technology unsuitable for a system requiring lower power consumption such as an infrared remote controller of consumer electric appliances.

On the other hand, the microcomputer 1 according to the first preferred embodiment is capable of detecting the state of each push-down switch only with the input ports IP without using the output port, and thus, is capable of waking up even when any switch of the plurality of the push-down switches SW is turned to be on-state. Accordingly, this microcomputer system is applicable to a system requiring lower power consumption such as an infrared remote controller of consumer electric appliances.

Further, by configuring the push-down switches SW as shown in FIG. 2, the push-down switches themselves invert the input levels of the input ports IP in the combination pattern allocated thereto with a simple configuration.

Figure 6:
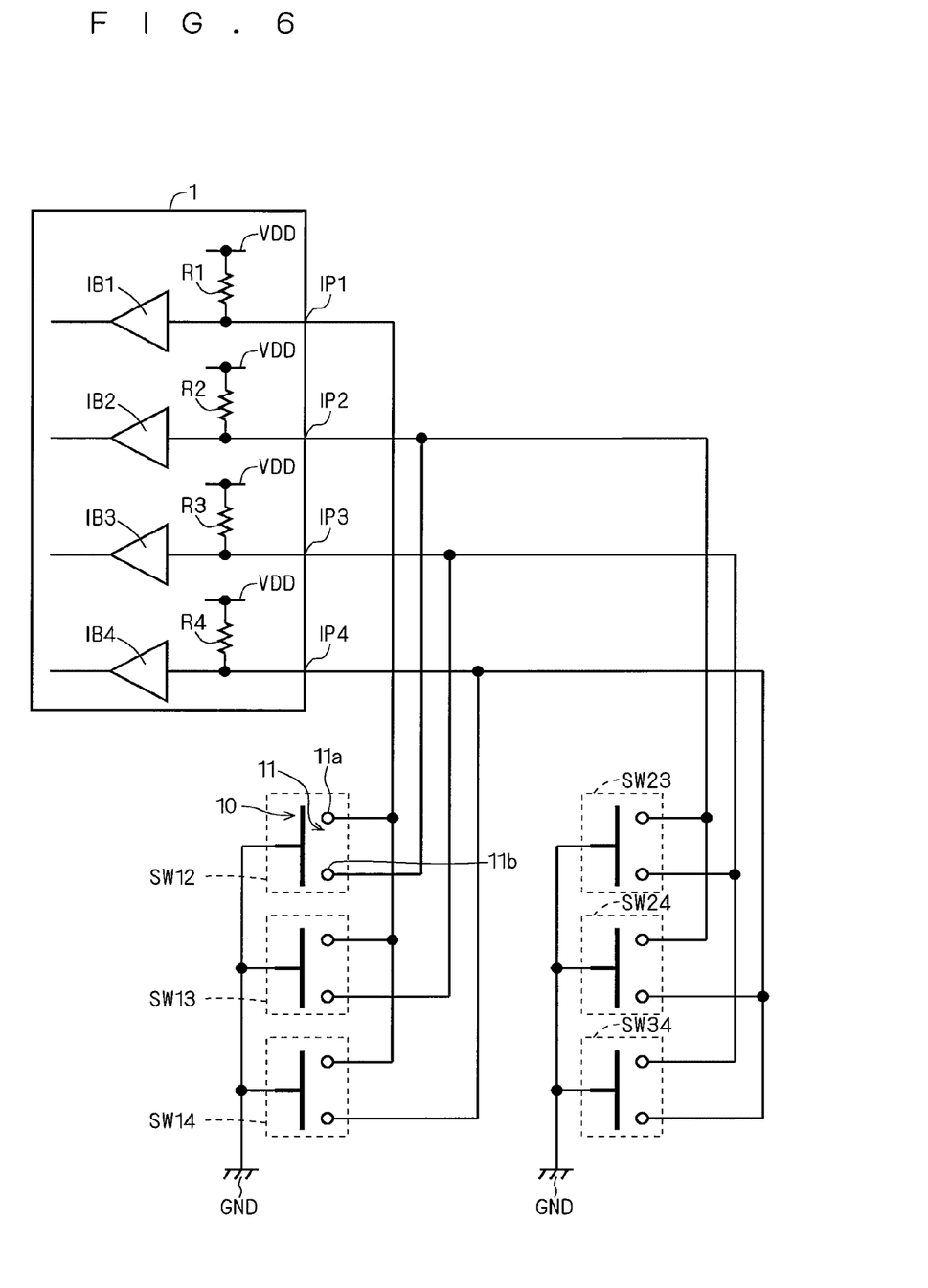
FIG. 6 is a view showing a configuration of another modification of the microcomputer system according to the first preferred embodiment of the invention.

In the above example, while a predetermined contact point in the fixed part 11 is connected to the reference potential GND, the push-down switches themselves invert the input levels of the input ports IP allocated thereto with a simple configuration even by connecting the conductive rubber 110 of the push-down part 10 to the reference potential GND, instead. FIG. 6 is a view showing the configuration of the microcomputer system in that case, and FIG. 7 is a view showing the configuration of each push-down switch in the microcomputer system shown in FIG. 6.

Figure 7:
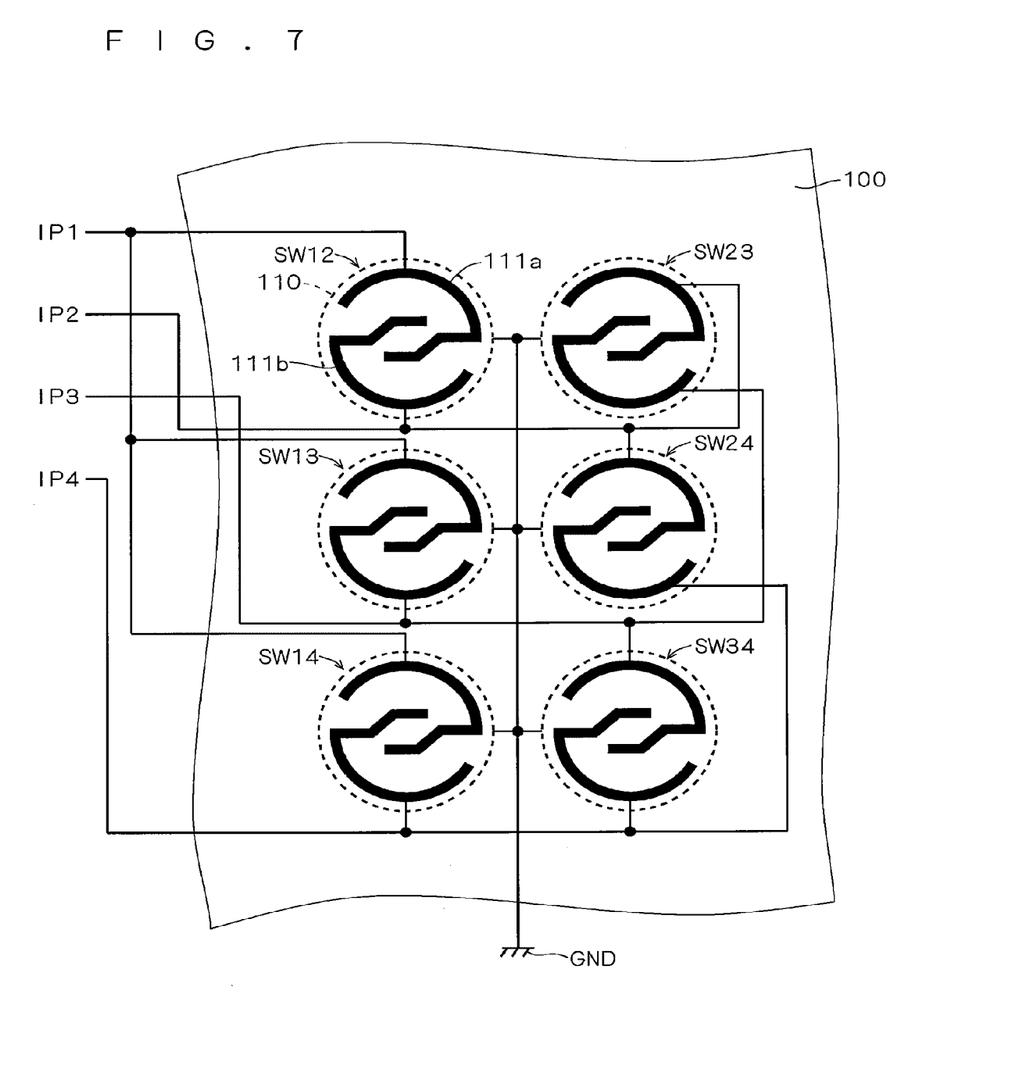
FIG. 7 is a view showing a configuration of a modification of the push-down switches according to the first preferred embodiment of the invention.

As shown in FIGS. 6 and 7, in each push-down switch SW, the conductive rubber 110 of the push-down part 10 is connected to the reference potential GND. Further, in each push-down switch SW, the fixed part 11 includes only two carbon patterns 111a and 111b, and these carbon patterns 111a and 111b are connected to two input ports IP in the combination pattern allocated to the push-down switch SW, respectively. Other configurations are same as those of the microcomputer system shown in FIG. 3.

In the microcomputer system having the configuration shown in FIGS. 6 and 7, when the push-down switch SW is pushed down, the conductive rubber 110 of the reference potential GND and the carbon patterns 111a and 111b make contact with each other to apply the reference potential GND to those carbon patterns 111a and 111b. As a result, the input levels of two input ports IP connected to the carbon patterns 111a and 111b are inverted. Thereby, the push-down switch SW itself inverts the input level of the input port IP allocated thereto with a simple configuration.

Further, in the above example, each of the input ports IP1 to IP4 in the microcomputer 1 is pulled up to the power supply potential VDD to connect a predetermined contact point (carbon pattern) of the fixed part 11 or the conductive rubber 110 of the push-down part 10 to the reference potential GND. Instead, the same effect is obtained by pulling down each of the input ports IP1 to IP4 to the reference potential GND via a resistor and connecting a predetermined contact point of the fixed part 11 or the conductive rubber 110 of the push-down part 10 to the power supply potential VDD.

As in the above, when a potential at a side of the push-down switch SW is set to be lower than a threshold potential of the input buffer IB, the input port IP may be pulled up to a potential higher than this threshold potential, and when a potential at a side of the push-down switch SW is set to be higher than the threshold potential of the input buffer IB, the input port IP may be pulled down to a potential lower than this threshold potential. That is, the potentials at the side of the push-down switch SW and at the side of the input port IP may be set such that the input buffer IB recognizes the change of the input level by pushing down the push-down switch SW.

A pull-up resistor for setting the input port IP at Hi level and a pull-down resistor for setting the input port IP at Low level, such as resistors R1 to R4, may be provided in the microcomputer 1, or at the side of the push-down switch SW. When the power supply potential VDD is 5 V and the reference potential GND is 0 V, a resistance value of the pull-up resistor and the pull-down resistor is preferably set to be from several MΩ to several kΩ, considering a current flowing at the time of pushing down the push-down switch SW. If the potentials at the side of the push-down switch SW and at the side of the input port IP are set to be at two potentials in a minute interval with the threshold potential of the input buffer IB therebetween such as being +10% and −10% from the threshold potential of the input buffer IB, the difference of the potentials gets smaller before and after pushing down the push-down switch SW and the current flowing therein is required to be little, thereby allowing the resistance value of the pull-up resistor and the pull-down resistor to be smaller. The pull-up resistor and the pull-down resistor may be composed of parasitic resistance such as resistance in a wiring itself and contact resistance in the push-down switch SW itself.

Second Preferred Embodiment

Figure 8:
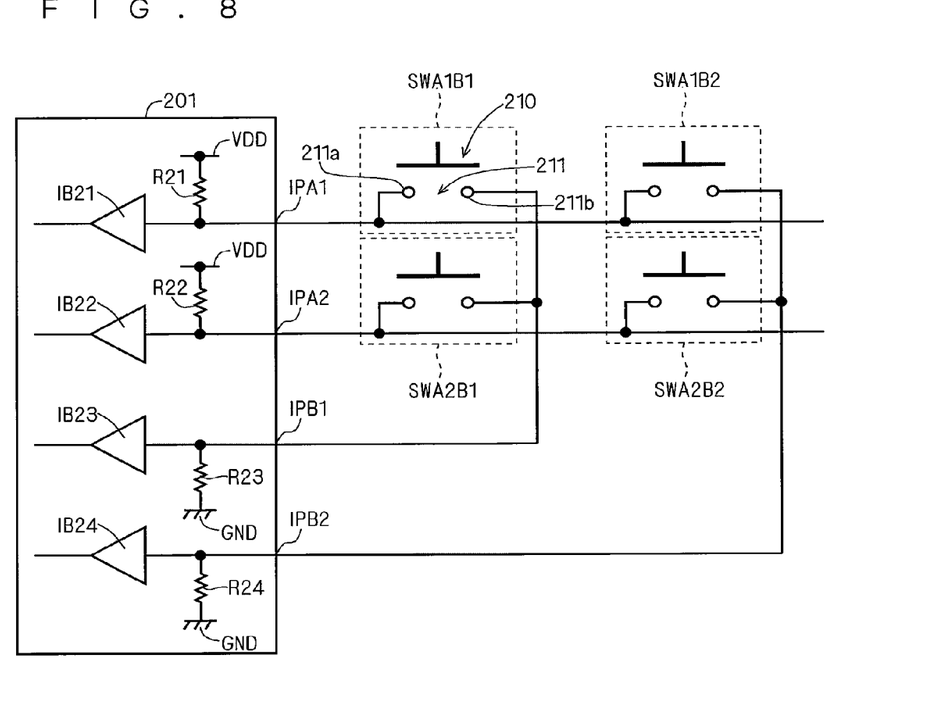
FIG. 8 is a view showing a configuration of a microcomputer system according to a second preferred embodiment of the invention.

FIG. 8 is a view showing a configuration of a microcomputer system according to a second preferred embodiment of the invention. The microcomputer system according to the second preferred embodiment is applicable to an infrared remote controller of consumer electric appliances such as a television and the like, for example.

As shown in FIG. 8, the microcomputer system according to the second preferred embodiment includes a microcomputer 201 composed of a CPU, a memory, and the like, and a plurality of push-down switches SWA1B1, SWA2B1, SWA1B2, and SWA2B2, which are housed in a casing. Hereinafter, when there is no need to distinguish the push-down switches SWA1B1, SWA2B1, SWA1B2, and SWA2B2, each of them is referred to as a "push-down switch SWAB".

The microcomputer 201 includes a plurality of input ports IPA1, IPA2, IPB1, and IPB2. The input ports IPA1, IPA2, IPB1, and IPB2 are connected to input terminals of input buffers IB21 to IB24, respectively. The input ports IPA1 and IPA2 are pulled up to the power supply potential VDD via resistors R21 and R22, respectively. On the other hand, the input ports IPB1 and IPB2 are pulled down to the reference potential GND via resistors R23 and R24, respectively. The resistance values of the resistors R21 to R24 are set to be the same value, for example. Hereinafter, when there is no need to distinguish the input ports IPA1 and IPA2, each of them is referred to as an "input port IPA". Similarly, when there is no need to distinguish the input ports IPB1 and IPB2, each of them is referred to as an "input port IPB".

Each push-down switch SWAB includes a push-down part 210 and a fixed part 211 making contact with the push-down part 210 when the push-down part 210 is pushed down. The fixed part 211 includes a plurality of contact points 211a and 211b making contact with the push-down part 210. The contact point 211a is connected to either one of the input ports IPA1 and IPA2, and the contact point 211b is connected to either one of the input ports IPB1 and IPB2. When the push-down part 210 makes contact with the contact points 211a and 211b, the contact points 211a and 211b are electrically connected to each other. Each push-down switch SWAB is composed of a conductive rubber and two carbon patterns formed on a substrate, in the same way as the push-down switch SW shown in FIG. 7 described above.

Either one of the input ports IPA1 and IPA2 and either one of the input ports IPB1 and IPB2 are allocated to each push-down switch SWAB with a different combination pattern. Specifically, the input ports IPA1 and IPB1 are allocated to the push-down switch SWA1B1, the input ports IPA2 and IPB1 are to the push-down switch SWA2B1, the input ports IPA1 and IPB2 are to the push-down switch SWA1B2, and the input ports IPA2 and IPB2 are to the push-down switch SWA2B2, respectively.

In each push-down switch SWAB, two contact points 211a and 211b of the fixed part 211 are connected to the input ports IPA and IPB allocated to the push-down switch SWAB, respectively. Specifically, the input ports IPA1 and IPB1 are connected to the contact points 211a and 211b of the push-down switch SWA1B1, the input ports IPA2 and IPB1 are to the contact points 211a and 211b of the push-down switch SWA2B1, the input ports IPA1 and IPB2 are to the contact points 211a and 211b of the push-down switch SWA1B2, and the input ports IPA2 and IPB2 are to the contact points 211a and 211b of the push-down switch SWA2B2, respectively.

In the microcomputer system according to the second preferred embodiment having the above configuration, when each push-down switch SWAB is off-state, all the input levels of the input ports IPA1 and IPA2 in the microcomputer 201 become Hi level ("1"), and all the input levels of the input ports IPB1 and IPB2 in the microcomputer 201 become Low level ("0").

When a certain push-down switch SWAB is pushed down to be on-state, the contact points 211a and 211b of the fixed part 11 in this push-down switch SWAB are electrically connected to each other, and the two input ports IPA and IPB connected to the contact points 211a and 211b are short-circuited to each other. The input port IPA is pulled up to the power supply potential VDD, and the input port IPB is pulled down to the reference potential GND. From this, if the input port IPA and the input port IPB are short-circuited, each potential thereof becomes a potential in which a potential difference between the power supply potential VDD and the reference potential GND is resistively divided, that is, an intermediate potential between the power supply potential VDD and the reference potential GND (hereinafter, simply referred to as an "intermediate potential").

Here, in each of the input buffers IB21 and IB22 according to the second preferred embodiment, a threshold potential determining the input level is set to be larger than the intermediate potential. Thus, in each of the input buffers IB21 and IB22, when an input potential is equal to the intermediate potential, the input level is determined to be Low level ("0"). In contrast, in each of the input buffers IB23 and IB24, the threshold potential determining the input level is set to be smaller than the intermediate potential. Accordingly, in each of the input buffers IB23 and IB24, when the input potential is equal to the intermediate potential, the input level is determined to be Hi level ("1"). Thus, when the input port IPA and the input port IPB are electrically connected to each other and each potential thereof becomes the intermediate potential, each of the input levels of those input ports IPA and IPB are inverted. In other words, the input level of this input port IPA becomes Low level ("0"), and the input level of this input port IPB becomes Hi level ("1").

If a ratio of the resistance value of the resistors R21 and R22 and the resistance value of the resistors R23 and R24 is set to be at 3 to 1, the intermediate potential is resulted in approximately a quarter of the power supply potential VDD. The input buffers IB21 to IB24 may be configured so as to recognize the intermediate potential which is low as the input level by comparing and balancing easiness of manufacturing the input buffers IB21 to IB24 and the operation thereof, and providing small and large to those resistance values, such as by setting the ratio of the resistance value of the resistors R21 and R22 and the resistance value of the resistors R23 and R24 to be 4 to 1, or 5 to 1, or by other means, thereby allowing the input levels of the input ports IPA and IPB to be inverted.

Figure 9:
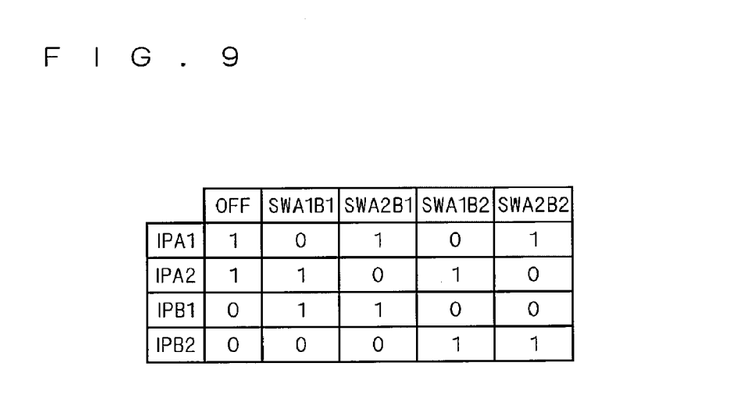
FIG. 9 is a view showing the input levels of the input ports when the push-down switches are pushed down in the microcomputer system according to the second preferred embodiment of the invention.

FIG. 9 is a view showing the input levels of the input ports IPA1, IPA2, IPB1, and IPB2 when each push-down switch SWAB is turned to be on-state. As shown in FIG. 9, when the push-down switch SWA1B1 is pushed down, the input levels of the input ports IPA1 and IPB1 allocated thereto are inverted. When the push-down switch SWA2B1 is pushed down, the input levels of the input ports IPA2 and IPB1 allocated thereto are inverted. When the push-down switch SWA1B2 is pushed down, the input levels of the input ports IPA1 and IPB2 allocated thereto are inverted. When the push-down switch SWA2B2 is pushed down, the input levels of the input ports IPA2 and IPB2 allocated thereto are inverted.

In the second preferred embodiment, either one of the input ports IPA1 and IPA2 and either one of the IPB1 and IPB2 are allocated to each push-down switch SWAB with the different combination pattern from each push-down switch SWAB. Therefore, as shown in FIG. 9, in the plurality of the push-down switches SWAB, the combination patterns of the input levels of the input ports IPA1, IPA2, IPB1, and IPB2 at the time of pushing down are different from each other. Thus, the microcomputer 201 detects which push-down switch SWAB is pushed down, by confirming the input levels of the input ports IPA1, IPA2, IPB1, and IPB2.

The microcomputer 201 according to the second preferred embodiment is capable of performing the sleep operation partially stopping its function in the same way as the microcomputer 1 according to the first preferred embodiment. During the sleep operation, the microcomputer 201 stops oscillation of its system clock, for example. Thereby, the operation of the CPU in the microcomputer 201 is stopped, allowing the power consumption to be greatly reduced.

The microcomputer 201 usually performs the sleep operation to reduce the power consumption. Then, when the push-down switch SWAB is pushed down to invert the input levels of the two input ports IPA and IPB allocated thereto, the microcomputer 201 wakes up to start the oscillation of the system clock, and the CPU in the microcomputer 201 starts the operation. The CPU having started the operation confirms the input levels of the input ports IPA1, IPA2, IPB1, and IPB2 to specify the push-down switch SWAB to be on-state, and performs the process in accordance with the push-down switch SWAB having been pushed down. Thereafter, the microcomputer 201 restarts the sleep operation to enter into the power-down mode.

As described above, in the microcomputer system according to the second preferred embodiment, any one of the plurality of the input ports IPA and any one of the plurality of the input ports IPB are allocated to each of the plurality of the push-down switches SWAB with different combination patterns from each other. For each of the plurality of the push-down switches, when one of the push-down switch SWAB is turned to be on-state, the input ports IPA and IPB allocated thereto are electrically connected to invert each input level of those input ports IPA and IPB, allowing the microcomputer 201 to individually detect the on-state of each push-down switch SWAB by using only the input ports. Thus, the microcomputer 201 detects the on-state of each push-down switch SWAB without outputting a signal through the output port. As a result, the process for detecting the state of the push-down switch SWAB in the microcomputer 201 is simplified.

In the microcomputer system according to the second preferred embodiment, the microcomputer 201 and the plurality of the push-down switches SWAB may be formed to be on the same print circuit board (PCB) to connect ground terminals of the input buffers IB21 to IB24 to terminals of the resistors R23 and R24 at a side of the reference potential GND on the PCB. That is, the reference potential GND connected to each push-down switch SWAB via a resistor may be in common with a reference potential supplied to the input buffers IB21 to IB24.

Also, in the microcomputer system according to the first preferred embodiment in the above, the microcomputer 1 and the plurality of the push-down switches SW may be formed on the same PCB to connect each of the ground terminals of the input buffers IB1 to IB4 of the microcomputer 1 to a contact point in the fixed part 11 of each push-down switch SW connected to the reference potential GND, on the PCB. That is, the reference potential GND connected to each push-down switch SW may be in common with a reference potential supplied to the input buffers IB1 to IB4.

Figure 10:
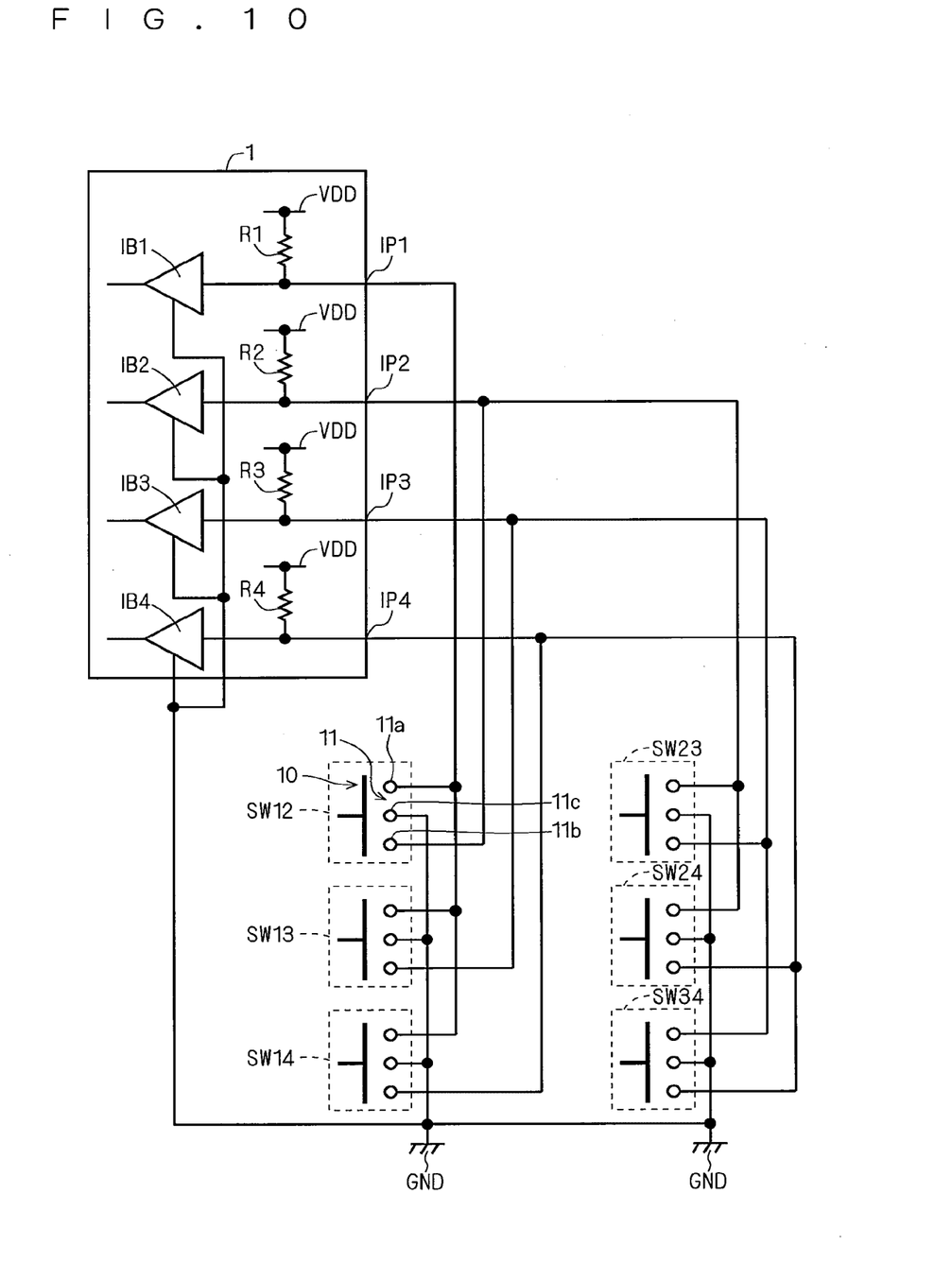
FIG. 10 is a view showing a configuration of a modification of the microcomputer system according to the first preferred embodiment of the invention.
Figure 11:
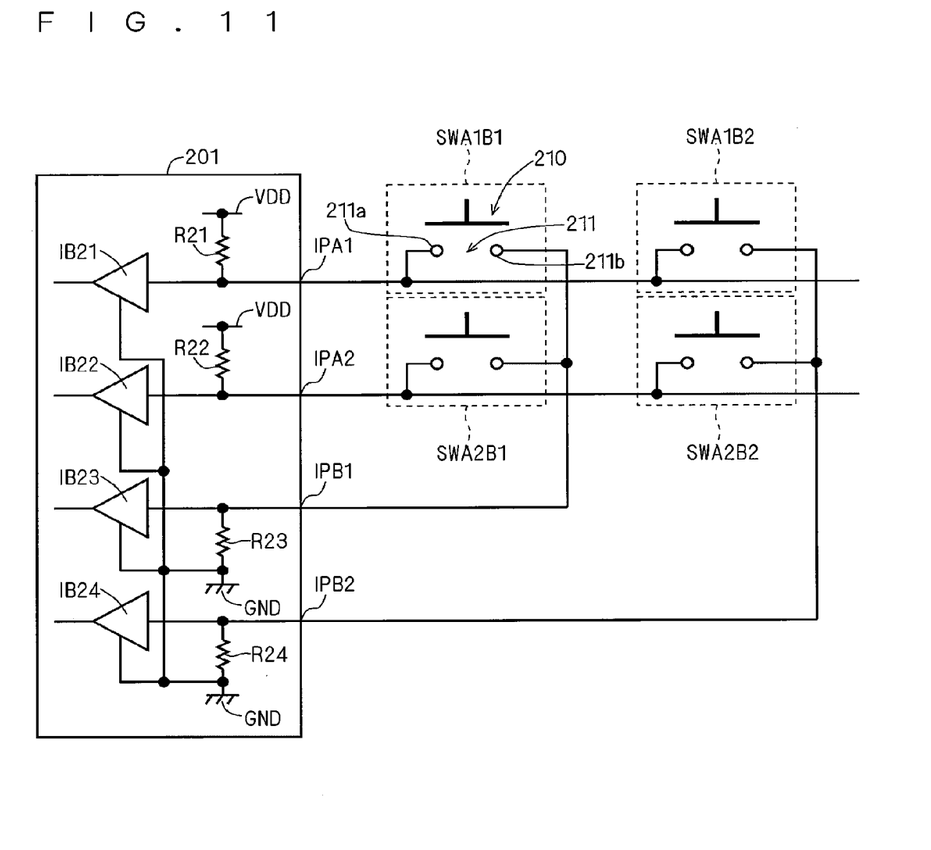
FIG. 11 is a view showing a configuration of a modification of the microcomputer system according to the second preferred embodiment of the invention.

FIG. 10 is a view showing the state of connecting the ground terminals of the input buffers IB1 to IB4 to a contact point 11c in the fixed part 11 of each push-down switch SW connected to the reference potential GND, on the PCB, in the microcomputer system according to the first preferred embodiment shown in FIG. 1 described in the above. Further, FIG. 11 is a view showing the state of connecting the ground terminals of the input buffers IB21 to IB24 to the terminals of the resistors R23 and R24 at the side of the reference potential GND on the PCB in the microcomputer system according to the second preferred embodiment shown in FIG. 8.

As described above, in the microcomputer system according to the first preferred embodiment, even if the power supply potential of the input buffers IB1 to IB4 is reduced for lower power consumption with the reference potential GND connected to each push-down switch SW as the reference potential connected to the input buffers IB1 to IB4, the detection of the push-down of each push-down switch SW is allowed to be easier in the microcomputer 1.

Similarly, in the microcomputer system according to the second preferred embodiment, even if the power supply potential of the input buffers IB21 to IB24 is reduced for lower power consumption with the reference potential GND connected to each push-down switch SWAB via resistors as the reference potential connected to the input buffers IB21 to IB24, the detection of the push-down of each push-down switch SWAB is allowed to be easier in the microcomputer 201.

While the invention has been shown and described in detail, the foregoing description is in all aspects illustrative and not restrictive. It is therefore understood that numerous modifications and variations can be devised without departing from the scope of the invention.

The invention claimed is:

1. A microcomputer system comprising:
a microcomputer including first to fourth input ports; and
first to sixth push-down switches, each of which includes an electric conductor coupled to a terminal to receive a ground level voltage, and first and second contacts coupled to the electric conductor when a corresponding push-down switch is turned on, wherein the first contacts of the respective first to third push-down switches are coupled to the first input port of the microcomputer, and the second contacts of the respective first to third push-down switches are coupled to the second to fourth input ports, respectively, the first contacts of the respective fourth to fifth push down switches are coupled to the second input port, and the second contacts of the respective fourth to fifth push-down switches are coupled to the third and fourth input ports, respectively, the first contact of the sixth push-down switch is coupled to the third input port, and the second contact of the sixth push-down switch is coupled to the fourth input port, and input voltages to be applied to two of the first to fourth input ports of the microcomputer shift to the ground level voltage, when one of the first to sixth push-down switches coupled to the two of the first to fourth input ports turns on.

2. The microcomputer system according to claim 1, wherein the microcomputer detects whether input voltages of the first to fourth input ports are sifted to ground level voltages or not, and determines which push-down switch is turned on based on the detection result.

3. The microcomputer system according to claim 1, wherein the microcomputer includes first to fourth pull-up resisters coupled to the first to fourth input ports, respectively, and the first to fourth pull-up resisters being for shifting voltages from the first to fourth input ports to higher voltages than the ground level voltage.

* * * * *